(12) United States Patent
Clendenning et al.

(10) Patent No.: US 10,658,487 B2
(45) Date of Patent: May 19, 2020

(54) SEMICONDUCTOR DEVICES HAVING RUTHENIUM PHOSPHORUS THIN FILMS

(71) Applicant: Intel Corporation, Santa Clara, CA (US)

(72) Inventors: Scott B. Clendenning, Portland, OR (US); Han Wui Then, Portland, OR (US); John J. Plombon, Portland, OR (US); Michael L. McSwiney, Scappoose, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/772,783

(22) PCT Filed: Dec. 9, 2015

(86) PCT No.: PCT/US2015/064844
§ 371 (c)(1),
(2) Date: May 1, 2018

(87) PCT Pub. No.: WO2017/099770
PCT Pub. Date: Jun. 15, 2017

(65) Prior Publication Data
US 2019/0252511 A1    Aug. 15, 2019

(51) Int. Cl.
*H01L 29/49* (2006.01)
*H01L 21/285* (2006.01)
(Continued)

(52) U.S. Cl.
CPC .......... *H01L 29/4966* (2013.01); *C23C 16/30* (2013.01); *H01L 21/28088* (2013.01);
(Continued)

(58) Field of Classification Search
CPC .......... H01L 21/28088; H01L 21/28556; H01L 29/4966
See application file for complete search history.

(56) References Cited

U.S. PATENT DOCUMENTS

2007/0264771 A1    11/2007  Ananthan et al.
2008/0224183 A1*   9/2008   Nawaz .............. H01L 29/66795
                                                             257/279
(Continued)

FOREIGN PATENT DOCUMENTS

JP       2003-188281 A      7/2003
KR   10-2011-0026657 A      3/2011

OTHER PUBLICATIONS

Locquet et al, "High-K dielectrics for the gate stack," Journal of Applied Physics 100 051610, 2006. (Year: 2006).*

(Continued)

*Primary Examiner* — Matthew L Reames
(74) *Attorney, Agent, or Firm* — Schwabe, Williamson & Wyatt, P.C.

(57) ABSTRACT

Embodiments of the present disclosure describe semiconductor devices with ruthenium phosphorus thin films and further describe the processes to deposit the thin films. The thin films may be deposited in a gate stack of a transistor device or in an interconnect structure. The processes to deposit the films may include chemical vapor deposition and may include ruthenium precursors. The precursors may contain phosphorus. A co-reactant may be used during deposition. A co-reactant may include a phosphorus based compound. A gate material may be deposited on the film in a gate stack. The ruthenium phosphorus film may be a metal diffusion barrier and an adhesion layer, and the film may be a work function metal for some embodiments. Other embodiments may be described and/or claimed.

19 Claims, 10 Drawing Sheets

(51) Int. Cl.
- *H01L 23/532* (2006.01)
- *C23C 16/30* (2006.01)
- *H01L 21/768* (2006.01)
- *H01L 21/28* (2006.01)
- *H01L 27/088* (2006.01)

(52) U.S. Cl.
CPC .. *H01L 21/28556* (2013.01); *H01L 21/76843* (2013.01); *H01L 23/53209* (2013.01); *H01L 23/53223* (2013.01); *H01L 23/53238* (2013.01); *H01L 23/53252* (2013.01); *H01L 23/53266* (2013.01); *H01L 27/0886* (2013.01)

(56) References Cited

U.S. PATENT DOCUMENTS

| | | | |
|---|---|---|---|
| 2009/0226611 A1* | 9/2009 | Suzuki | H01L 21/76843 427/250 |
| 2012/0032332 A1* | 2/2012 | Lim | H01L 21/28088 257/751 |
| 2012/0104400 A1 | 5/2012 | Lee et al. | |
| 2012/0217591 A1* | 8/2012 | Kamada | H01L 23/53223 257/410 |
| 2013/0056795 A1* | 3/2013 | Wu | H01L 29/66795 257/191 |
| 2014/0027865 A1 | 1/2014 | Seo et al. | |

OTHER PUBLICATIONS

International Search Report and Written Opinion dated Aug. 18, 2016 for International Application No. PCT/US2015/064844, 13 pages.

Jinhong Shin et al., "Growth of Ultrathin Films of Amorphous Ruthenium—Phosphorus Alloys Using a Sing Source CVD Precursor", Oct. 15, 2006, 2 pages, JACS Communications.

Jinhong Shin et al, "Effects of P on amorphous chemical vapor deposition Ru—P alloy films Cu interconnect liner applications", Jul. 1, 2008, 6 pages, J. Vac. Sci. Technol. A 26 (4) . . . , Jul./Aug. 2008.

Lucas B. Henderson et al., "Time-to-failure analysis of 5 nm amorphous Ru(P) as a copper diffusion barrier", 2009, 5 pages, journal homepage: www.elsevier.com/locate/tsf.

* cited by examiner

SEMICONDUCTOR DEVICES HAVING RUTHENIUM PHOSPHORUS THIN FILMS

CROSS REFERENCE TO RELATED APPLICATIONS

The present application is a national phase entry under 35 U.S.C. § 371 of International Application No. PCT/US2015/064844, filed Dec. 9, 2015, entitled "SEMICONDUCTOR DEVICES HAVING RUTHENIUM PHOSPHORUS THIN FILMS", which designated, among the various States, the United States of America. The Specifications of the PCT/US2015/064844 Application is hereby incorporated by reference.

FIELD

Embodiments of the present disclosure generally relate to semiconductor devices having ruthenium phosphorus thin films.

BACKGROUND

Thin films are used in semiconductor devices to provide a number of different properties. Generally, the design and deposition of a thin film may be a compromise between some properties such as film resistivity, thickness, and the ability of the film to server as a metal diffusion barrier, as well as a nucleation layer. Ideally, a thin film may be a conformal film; however, real films generally exhibit some degree of thickness variation. Currently available thin films may not have sufficiently low resistivity, may have too much thickness variability, may have insufficient metal diffusion resistance, and/or may not provide good nucleation for additional layers. For example, currently available films may not have sufficient metal diffusion resistance to interconnect metals such as copper, to strong N-type metals such as titanium aluminum alloys and aluminum for silicon-based n-type metal oxide semiconductor (NMOS) transistor devices, and for group III-V based NMOS transistor devices. As another example, currently available films, such as titanium nitride or tantalum nitride, may not serve as a good nucleation layer for chemical vapor deposition of aluminum or titanium, as well as their alloys.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
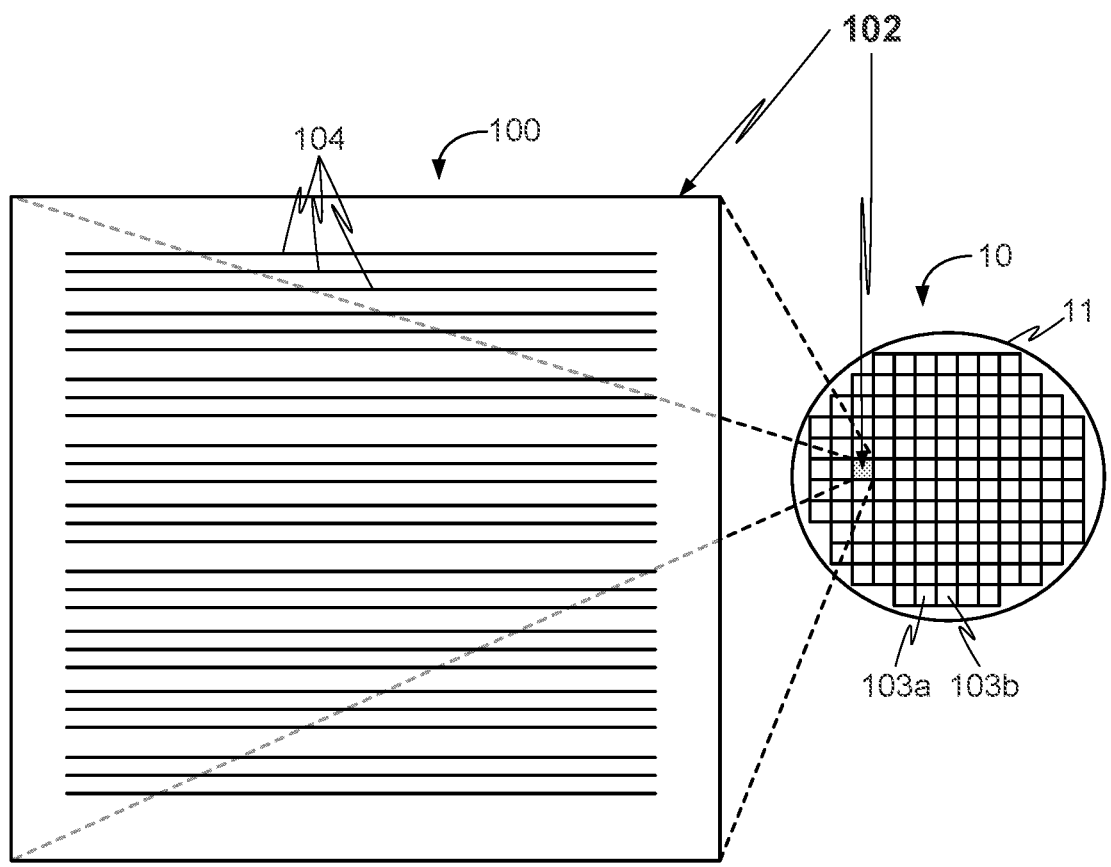
FIG. 1 schematically illustrates a top view of an example die in wafer form and in singulated form, in accordance with some embodiments.

Embodiments of the present disclosure describe semiconductor devices having a ruthenium-phosphorus alloy film deposited thereon. Further described are systems with a semiconductor device with a ruthenium-phosphorus alloy film deposited on the device.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Generally, thin films on semiconductor devices may provide selected functionality such as a specific resistivity and may be a metal diffusion barrier. To provide a needed functionality, a thin film may need to have good conformal properties and may need to be very thin to meet certain design and performance criteria. Moreover, thin films may need to have further layers attached to the film, and thus such films may need to have suitable nucleation properties for forming additional layers. The materials used for a thin film and the deposition method may be factors in achieving a film that is very thin, has proper conductivity/resistivity, serves as a good diffusion barrier against certain metals, is conformal, and has good nucleation properties for other layers to be attached to the film. Thin films may be composed of metals or metal alloys and may include selected metals and other atoms and/or compounds in selected proportions to impart desired properties to a semiconductor device. Thin metal films may be fractions of a nanometer (monolayer) up to several micrometers, depending on the desired properties.

In various embodiments, the thin metal films may be formed on semiconductor devices by one or more deposition methods, such as atomic layer deposition (ALD), chemical vapor deposition (CVD), physical vapor deposition (PVD). The one or more deposition methods, optionally nay include plasma enhanced deposition. Other methods may be used to form such films. Some methods may be used with other methods for sequential formation of a film on another film. Forming a metal film may require several processing steps, which may include use of various gases and/or co-reactants. In deposition processes, a precursor typically is used and may be comprised of a metal that is complexed with, or bound to, an organic compound. A metal-organic complex may include numerous organic molecules bound to a single metal atom. The precursor may be subsequently deposited on a surface to form a thin film, which may be further processed to form a film comprised of the metal component of the precursor or an ahoy of the metal. There may be some residual amount of the organic component attached to the film. The organic compound used to form a complex with a metal of a precursor may be referred to as a ligand. The choice of a ligand generally may have an impact on the ability to effectively form a metal film via deposition processes with the desired properties and performance.

Regarding ALD, this method generally is a self-limiting thin film growth process in which a heated substrate may be repeatedly and separately exposed to a precursor molecule and, optionally, a co-reactant in a sequential manner in a gas phase. The process is self-limiting because reaction stops after all reactive sites of a substrate are reacted during a cycle. ALD may provide highly conformal and uniform films and further may allow the manufacture of ultrathin (less than 300 Å) films at a relatively low deposition temperature. ALD temperature may be from approximately 80° C. to 450° C., depending on precursor characteristics such as volatility.

Regarding CVD, this method generally is a chemical process that may be used to produce thin films of various compositions. In typical CVD, a substrate may be exposed to a volatile precursor that may react and/or decompose on the substrate surface to produce a thin film, including a thin metal film. There may be volatile by-products produced during the CVD process. These by-products may be removed by gas flow through the CVD reaction chamber. A CVD process may be a plasma enhanced CVD process.

To form a thin film of a metal or a metal-containing material on a semiconductor substrate via a deposition process, selected materials may be used including precursors, co-reactants, and/or gases, as previously indicated. The precursors generally are comprised of a metal that is complexed with an organic compound—a ligand, as previously described. To form the organic-metal complex, the ligand needs to have certain bonding abilities that allow it to coordinate with the metal. The number of ligands coordinated with a selected metal depends on the coordination number of the metal. For example, a ligand-metal complex may be comprised of numerous ligands for each metal atom, depending on the coordination number of the metal.

In some embodiments, a ruthenium (Ru)-phosphorus (P) film may be formed on semiconductor devices to provide desirable properties to the devices. A Ru—P film may be referred to as a Ru—P alloy film. The film may be formed by different embodiments of one or more deposition processes such as ALD and/or CVD. In some embodiments, the films may be ultrathin, on the order of approximately 1 to 5 nanometers, and may be used as effective diffusion barriers against other metals. In some embodiments, the films may be highly conformal and may provide effective adhesion layers in transistor device contacts, gate structures, or the back end of line interconnects. In some embodiments, the films may be effective as conductive liners. In some embodiments, Ru—P films may be conformal, ultrathin, a conductive liner, a work function metal, a good diffusion barrier, and/or a good adhesion layer/nucleation layer.

In some embodiments, a Ru—P film may be deposited on a substrate by CVD in a vacuum chamber. The deposition may be performed by heating the substrate at a temperature of approximately 200° C. to 450° C. The temperature may depend on the precursor used for deposition. The deposition may occur at a pressure of approximately 0.1 to 20 mm Hg. Deposition of a precursor may be by a continuous method or by a pulsed method, or a combination thereof. In addition to a precursor, a deposition process may include a carrier gas, such as nitrogen ($N_2$) or argon (Ar), by way of example and not limitation. Other carrier gases, such as inert gases, may be used.

A co-reactant may be used during deposition. Co-reactants may include one or more compounds such as hydrogen ($H_2$); ammonia ($NH_3$); phosphine ($PH_3$); an alkylphosphine such as a monoalkylphosphine ($H_2PR$), a dialkylphosphine (HPRR') or a trialkylphosphine (PRR'R") where R, R' and R" may be methyl, ethyl, propyl, isopropyl, or t-butyl; and/or a substituted or unsubstituted hydrazine ($N_2H_4$) where one or more of the hydrogens may be substituted with various groups including, by way of example and not limitation, alkyl groups. In some embodiments, a precursor for deposition of a Ru—P film may include P in the precursor. In some embodiments, a precursor for deposition of a Ru—P film may not include P and may contain only Ru, which may be bound by a ligand compound for example. For precursors without P, a Ru—P film may be formed by including a co-reactant containing P. In some embodiments where the precursor includes P, a co-reactant with P may be included to further adjust the amount of P in a Ru—P film. In some embodiments, the deposition process may include one precursor or may include a combination of two or more precursors, where the precursors may or may not include P. The term ruthenium precursor may include precursors with ruthenium and/or precursors with ruthenium and phosphorus.

In some embodiments, a precursor may thermally decompose on a surface of a substrate to form a Ru—P film. One or more co-reactants may be included to form the Ru—P film, where the co-reactants may include P, as previously discussed. In some embodiments, the film may contain approximately 5 to 30 atomic percent P. In some embodiments where a co-reactant gas is used to deposit a Ru—P film, the co-reactant gas may be provided continuously to the surface of the substrate or may be provided as an intermittent pulse of gas. In some embodiments, a co-reactant gas may be provided in its molecular form or may be provided in a plasma-activated form. In embodiments where the precursor is a Ru precursor, a Ru—P film may be deposited on a substrate using a co-flow of $PH_3$ or an alkylphoshine such as a monoalkylphosphine ($H_2PR$), a dialkylphosphine (HPRR') or an trialkylphosphine (PRR'R") where R, R' and R" may be alkyl groups, alone or in combination with one or more co-reactants. The alkyl group may be methyl, ethyl, propyl, isopropyl or t-butyl, by way of example and not limitation. In some embodiments, a co-flow of $PH_3$ or an alkylphosphine alone or in combination with one or more co-reactants may be used to deposit Ru—P films where the precursor contains Ru and P in order to provide further control of the amount of P in the film.

In some embodiments, precursors for Ru—P films may contain phosphorus (Ru—P precursors) and may include Ru bound in a compound such as $Ru(PF_3)_4H_2$ and cis-$H_2Ru(P(CH_3)_3)_4$, by way of example and not limitation. Ru—P precursors may include Ru bound by a bidentate ligand containing P, such as $R_2PCH_2CH_2PR_2$, for example, or Ru bound by a tridentate ligand containing P, such as $R_2PCH_2CH_2NHCH_2CH_2PR_2$, for example. The R group may be methyl, ethyl, propyl, isopropyl, or t-butyl or various combinations thereof.

In some embodiments, the one or more precursors for the Ru—P film may not contain P and may include Ru bound by a ligand compound. For example, the precursors for the Ru—P film may include bis(cyclopentadienyl) ruthenium, bis(alkyl-cyclopentadienyl) ruthenium, ruthenium amidinate complexes, ruthenium d azadiene complexes, or ruthenium carbonyl complexes. The alkyl group of bis(alkyl-cyclopentadienyl) ruthenium may be methyl, ethyl, t-butyl, or isopropyl.

In some embodiments, a Ru—P film may be deposited on a substrate of a semiconductor device, where the substrate may include Hydrogen (H)-terminated silicon; silicon; silicon-germanium; germanium; a compound semiconductor of Group III-V; a main-group oxide such as tin oxide, germanium oxide, or germanium silicon oxide; a metal oxide; a low-kappa ($\kappa$) gate dielectric; silicon oxide; a binary or mixed metal oxide; or silicate. In some embodiments, the substrate may be implanted/doped with an element such as carbon, phosphorus, boron, or beryllium, for example. Group III-V semiconductors may include boron nitride, boron phosphide, boron arsenide, aluminium nitride, aluminium phosphide, aluminium arsenide, aluminium antimonide, gallium nitride, gallium phosphide, gallium arsenide, gallium antimonide, indium nitride, indium phosphide, indium arsenide, and indium antimonide. A low-kappa dielectric material may mean a material having a low dielectric constant in comparison to silicon dioxide. A low-kappa dielectric material may be an interlayer dielectric material.

In some embodiments, the substrate may be activated prior to deposition by exposure to an organic or inorganic nucleation promoting substance. In some embodiments, the deposition may be by CVD, and the nucleation promoting substance may be deposited by ALD.

A thin film of Ru—P may be deposited on substrates of various semiconductor devices, as previously described. For example, in some embodiments, a thin film of Ru—P may be deposited between a high-kappa dielectric material layer and a work function metal in a gate stack of a silicon, silicon germanium, or germanium-based transistor device. A high-kappa dielectric material layer may be composed of, for example, hafnium-based high-kappa dielectrics, nitrided hafnium silicates (HfSiON) dielectric, hafnium silicate, zirconium silicate, hafnium dioxide, zirconium dioxide, and/or another suitable material. A high-kappa dielectric material layer may be deposited using ALD or CVD, for example. A high-kappa dielectric may refer to a material having a value of a dielectric constant more than that of silicon nitride, which may have a value of about 7. A low-kappa dielectric refer to a material having a value of a dielectric constant less than that of silicon dioxide, which may have a value of about 3.9.

In some embodiments, a thin film of Ru—P may be deposited between a liner material and a work function metal in a gate stack of a silicon-, silicon germanium-, or germanium-based transistor device. The liner material may be deposited on a high-kappa dielectric material layer of the device. The liner material may be a dielectric material such as a nitride of silicon, titanium, or tantalum. The liner material may be approximately 5-100 Angstroms thick.

In some embodiments, a thin film of Ru—P may be deposited on a high-kappa dielectric material layer in the gate region of a Group III-V based transistor device. The film may function as a work function metal. In this embodiment, there may be no need to have a separate diffusion barrier.

In some embodiments, a thin film of Ru—P may be deposited on a low-kappa dielectric material layer in an interconnect structure of a semiconductor device. The low-kappa dielectric material layer may be composed of a build-up material or a silicon oxide material.

In some embodiments, a gate material may be deposited on a Ru—P thin film to form a gate stack. The gate material may be a metal, such as aluminum, for example. The gate material may be doped polysilicon. In some embodiments, the doped polysilicon may be highly doped with donors or acceptors.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more transistor assemblies and/or other device assemblies that include Ru—P thin films formed by a deposition process as disclosed herein. For example, the die 102 may include circuitry having transistor structures 104 and/or other device structures with Ru—P thin films deposited using the materials and processes described herein. The Ru—P thin films may provide advantages over other thin films, where the advantages may include one or more of the following: highly conformal, ultrathin, a good conductive liner, a good work function metal, a good diffusion barrier, and/or a good adhesion layer/nucleation layer.

Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted. After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from approximately 25.4 mm to approximately 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
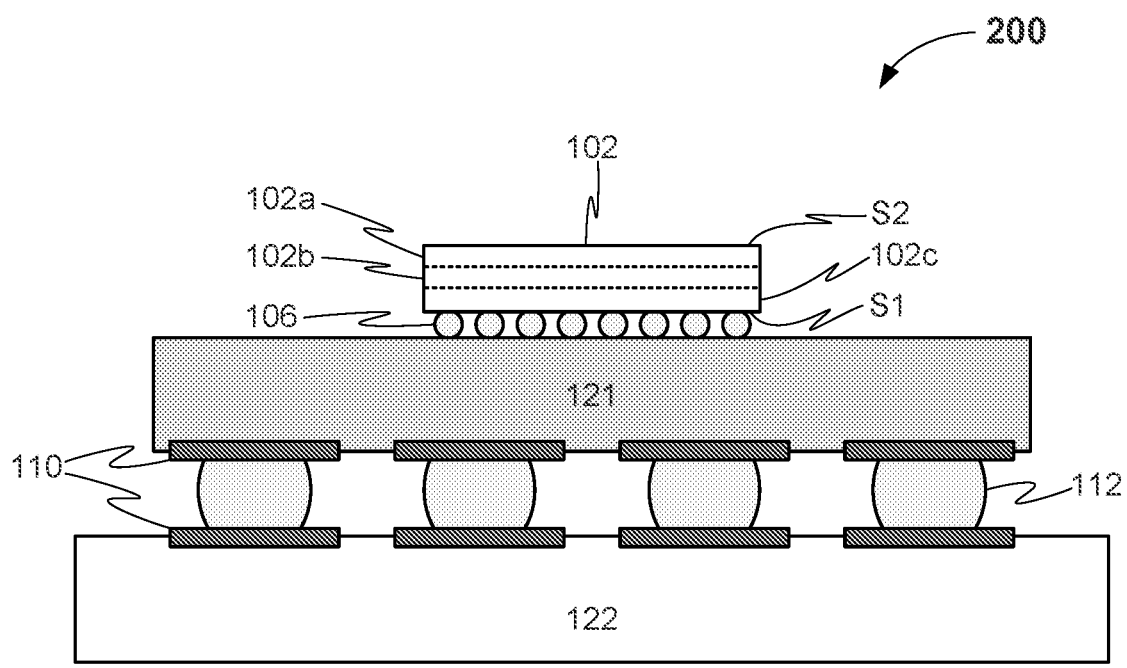
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an integrated circuit (IC) assembly 200 may include one or more of the die 102, package substrate 121 and/or circuit board 122, according to various embodiments. Embodiments described herein for Ru—P thin metal films may be incorporated in the one or more die 102, according to various embodiments. The Ru—P thin metal films may be formed as described and disclosed herein. The Ru—P thin films may provide advantages over other thin films, where the advantages may include one or more of the following: highly conformal, ultrathin, a good conductive liner, a good work function metal, a good diffusion barrier, and/or a good adhesion layer/nucleation layer.

The die 102 may represent a discrete product made from a semiconductor material (e.g., silicon) using semiconductor fabrication techniques such as thin film deposition, lithography, etching and the like used in connection with forming complementary metal oxide semiconductor (CMOS) devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1 of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures (e.g., electrode terminals) that are configured to route electrical signals to or from the active devices in the device layer 102b. For example, the interconnect layer 102c may include horizontal lines (e.g., trenches) and/or vertical plugs (e.g. vias) or other suitable features to provide electrical routing and/or contacts.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FRA), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard.

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu) and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3A:
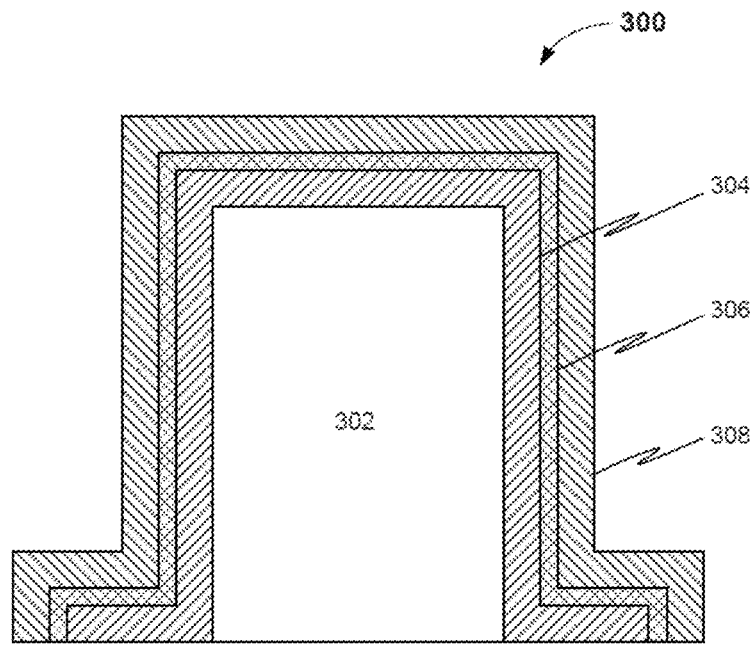
FIGS. 3A-3B schematically illustrates a cross-section view and a three dimensional view of a gate region of a tri-gate transistor having a thin film of ruthenium-phosphorus deposited on a high-kappa dielectric material layer, in accordance with some embodiments.

FIGS. 3 A-3B schematically illustrates a cross-section view and a three dimensional view of a gate region of a tri-gate transistor 300 having a thin film of ruthenium-phosphorus 306 deposited on a high-kappa dielectric material layer 304, in accordance with some embodiments. In some embodiments, the tri-gate transistor 300 may be a silicon-, silicon germanium-, or germanium-based transistor. In some embodiments, the tri-gate transistor 300 may have a fin 302 comprised of a substrate material, as illustrated. The substrate material may be silicon, silicon germanium, germanium, or another suitable material, and may be treated and/or doped as previously discussed.

In some embodiments, the fin 302 may have a high-kappa dielectric material layer 304 coupled to the fin 302. The high-kappa dielectric material may be one or more of the previously disclosed materials, and may be deposited via any suitable process, such as ALD or CVD.

In some embodiments, the high-kappa dielectric material layer 304 may have a Ru—P thin film 306 coupled to the high-kappa dielectric material layer 304. The Ru—P thin film 306 may be formed by a deposition method using a precursor containing Ru or Ru and P, as previously discussed. The deposition method may include any of the methods disclosed herein, including CVD or PVD. The deposition method may be a plasma enhanced deposition method. The deposition method may use the methods and materials as previously discussed. In some embodiments, the Ru—P thin film 306 may be approximately 1 to 5 nanometers thick. The Ru—P thin film 306 may function as a metal diffusion barrier, a nucleation promotor, and/or an adhesion layer.

In some embodiments, the Ru—P thin film 306 may have a gate material layer (work function layer) 308 coupled to the Ru—P thin film 306. The gate material layer 308 may be composed of aluminum or some other conducting metal. The gate material layer may alternatively or additionally include doped polysilicon.

The Ru—P thin films may provide advantages over other thin films, where the advantages may include one or more of the following: highly conformal, ultrathin, a good conductive liner, a good work function metal, a good diffusion barrier, and/or a good adhesion layer/nucleation layer.

Figure 3B:
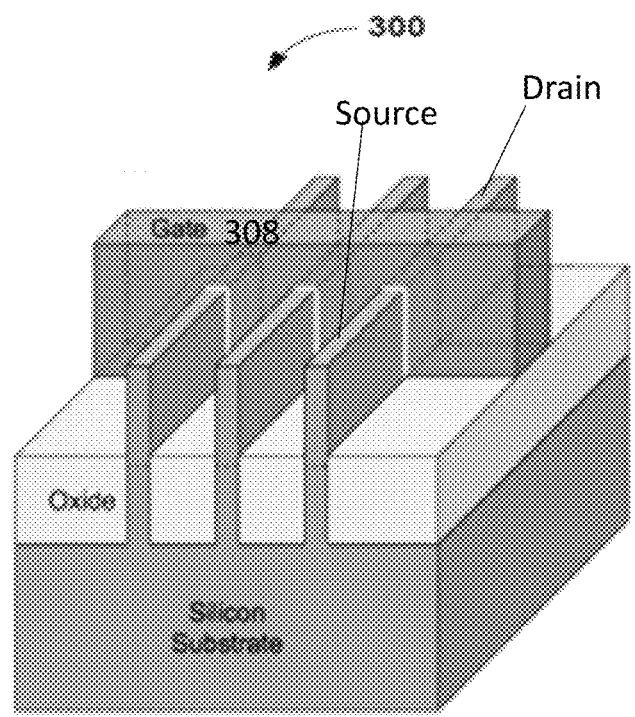

As shown in FIG. 3B, the tri-gate transistor 300 further includes multiple source areas on one side of the gate material layer 308, and multiple drain areas on another side of the gate material layer 308 that is opposite to the side the multiple source areas are located. There may be an oxide layer under the gate material layer 308 and above the silicon substrate.

Figure 4:
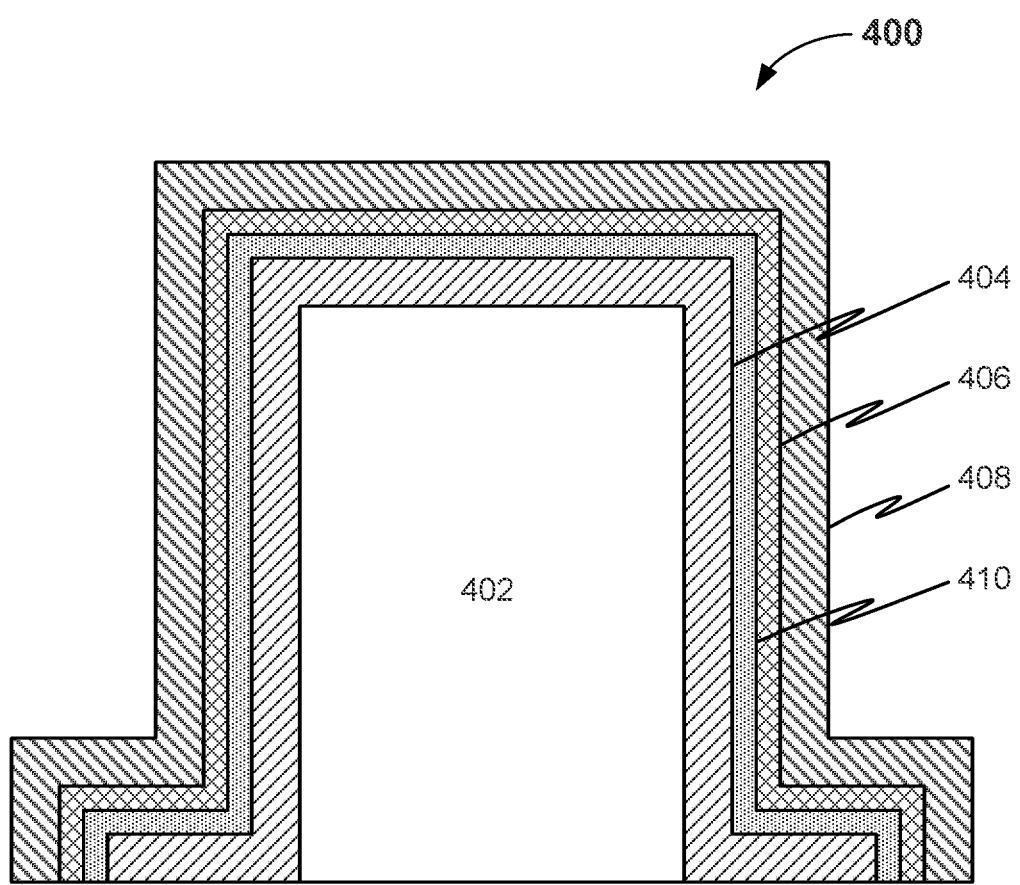
FIG. 4 schematically illustrates a cross-section of a gate region of a tri-gate transistor having a thin film of ruthenium-phosphorus deposited on a liner material layer, in accordance with some embodiments.

FIG. 4 schematically illustrates a cross-section of a gate region of a tri-gate transistor 400 having a thin film of ruthenium-phosphorus 406 deposited on a liner material layer 410, in accordance with some embodiments. In some embodiments, the tri-gate transistor 400 may be a silicon-, silicon germanium-, or germanium-based transistor. In some embodiments, the tri-gate transistor 400 may have a fin 402 comprised of a substrate material, as illustrated. The substrate material may be any suitable material, such as silicon, silicon germanium, or germanium and may be treated and/or doped as previously discussed.

In some embodiments, the fin 402 may have a high-kappa dielectric material layer 404 coupled to the fin 402. The high-kappa dielectric material may be a material as previously described and may be deposited via any suitable process, such as ALD or CVD.

In some embodiments, the high-kappa dielectric material layer 404 may have a liner material layer 410 coupled to the high-kappa dielectric material layer 404. The liner material may be a dielectric material such as a nitride of silicon, titanium, or tantalum. The liner material may be approximately 5-100 Angstroms thick.

In some embodiments, the liner material layer 410 may have a Ru—P thin film 406 coupled to the liner material layer 410. The Ru—P thin film 406 may be formed by a deposition method using a precursor containing Ru or Ru and P, as previously discussed. The deposition method may include any one or more of the methods disclosed herein, including CVD or PVD. The deposition method may use the methods and materials as previously discussed. The deposition method may be a plasma enhanced deposition method. In some embodiments, the Ru—P thin film 406 may be approximately 1 to 5 nanometers thick. The Ru—P thin film 406 may function as a metal diffusion barrier, a nucleation promotor, and/or an adhesion layer.

In some embodiments, the Ru—P thin film 406 may have a gate material layer (work function layer) 408 coupled to the Ru—P thin film 406. The gate material layer 408 may be composed of aluminum or some other conducting metal. The gate material layer 408 may alternatively or additionally include doped polysilicon.

The Ru—P thin films may provide advantages over other thin films, where the advantages may include one or more of the following: highly conformal, ultrathin, a good conductive liner, a good work function metal, a good diffusion barrier, and/or a good adhesion layer/nucleation layer.

Figure 5:
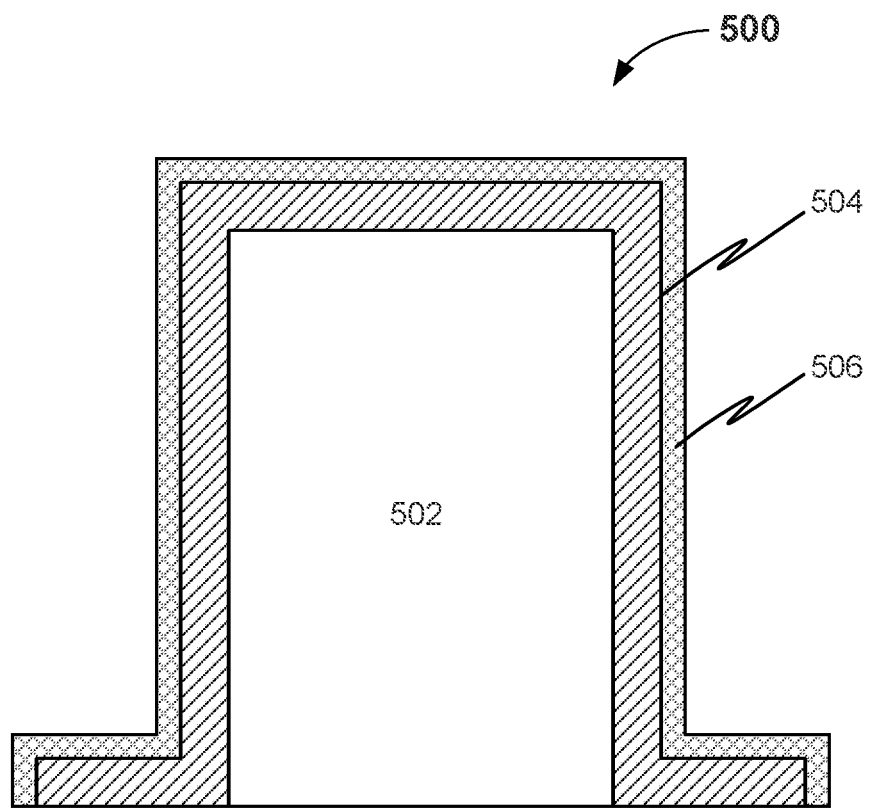
FIG. 5 schematically illustrates a cross-section of a gate region of a tri-gate transistor having a thin film of ruthenium-phosphorus deposited on a high-kappa dielectric material layer, in accordance with some embodiments.

FIG. 5 schematically illustrates a cross-section of a gate region of a tri-gate transistor 500 having a thin film of ruthenium-phosphorus 506 deposited on a high-kappa dielectric material layer 504, in accordance with some embodiments. In some embodiments, the tri-gate transistor 500 may be a Group III-V based transistor. In some embodiments, the tri-gate transistor 500 may have a fin 502 comprised of a substrate material, as illustrated. The substrate material may be a Group III-V semiconductor material. The Group III-V semiconductor material may be any of the materials previously discussed.

In some embodiments, the fin 502 may have a high-kappa dielectric material layer 504 coupled to the fin 502. The high-kappa dielectric material may be a material as previously described and deposited via ALD or CVD.

In some embodiments, the high-kappa dielectric material layer 504 may have a Ru—P thin film 506 coupled to the high-kappa dielectric material layer 504. The Ru—P thin film 506 may be formed by a deposition method using a precursor containing Ru or Ru and P, as previously discussed. The deposition method may include any of the methods disclosed herein, including CVD or PVD. The deposition method may use the methods and materials as previously discussed. The deposition method may be a plasma enhanced deposition method. In some embodiments, the Ru—P thin film 506 may be approximately 1 to 5 nanometers thick. The Ru—P thin film 506 may function as a metal diffusion barrier, a nucleation promotor, and/or an adhesion layer. The Ru—P thin film 506 may function as a work function metal, where there may be no need to have a separate diffusion barrier.

Figure 6:
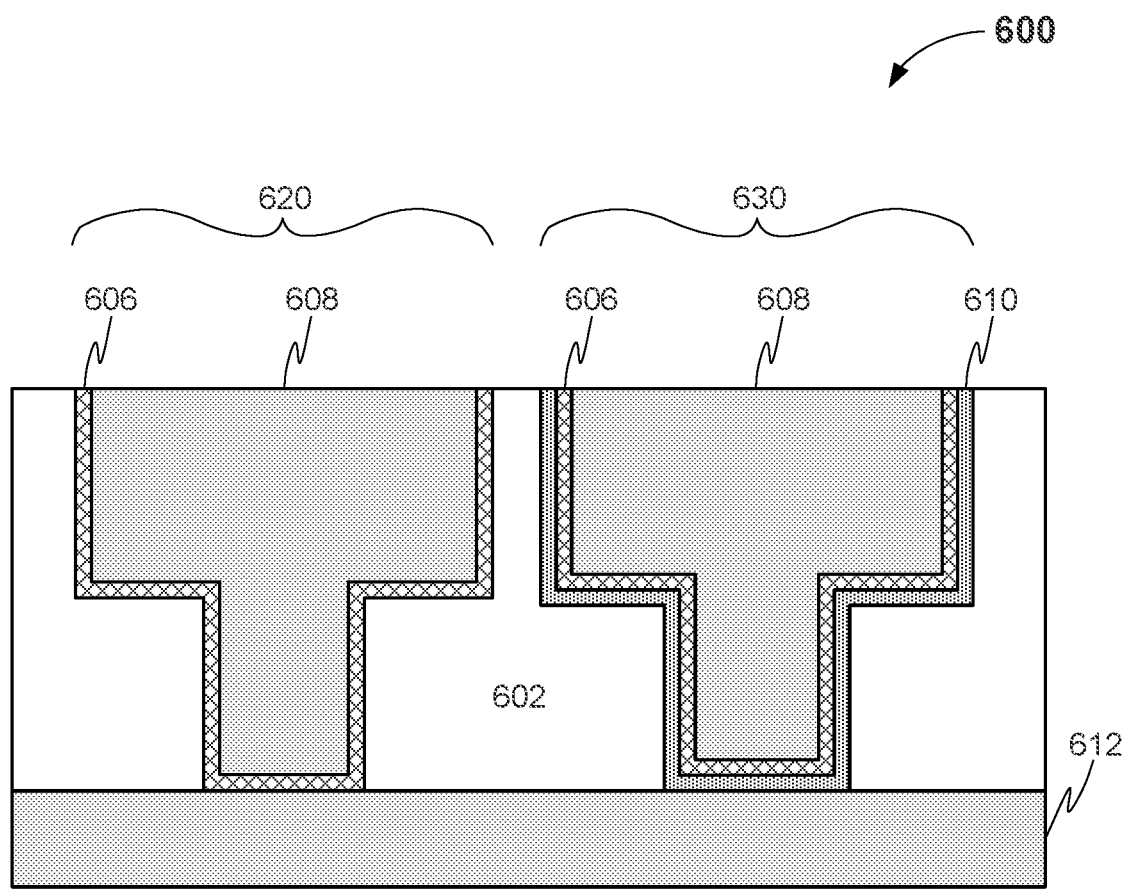
FIG. 6 schematically illustrates a cross-section of an interconnect structure of a semiconductor device with a ruthenium phosphorus thin film, in accordance with some embodiments.

FIG. 6 schematically illustrates a cross-section 600 of an interconnect structure of a semiconductor device with a ruthenium phosphorus thin film 606, in accordance with some embodiments. In some embodiments, the cross-section 600 of the interconnect structure may have substrate 602 composed of silicon dioxide or doped silicon dioxide. The substrate 602 may be an interlayer dielectric. In some embodiments, the cross-section 600 of the interconnect structure may have a substrate 602 composed of a low-kappa dielectric. A low-kappa dielectric material may include, for example, carbon infused/doped silicon dioxide or fluorinated silicon dioxide.

In some embodiments, the substrate 602 may have an underlying metal layer 612 coupled to the substrate 602. The underlying metal layer 612 may be composed of aluminum, copper, nickel, cobalt, ruthenium, palladium or some other conducting metal or alloy.

In some embodiments, as illustrated by interconnect 620, the substrate 602 may have a Ru—P thin film 606 coupled to the substrate 602. The Ru—P thin film 606 may be formed by a deposition method using a precursor containing Ru or Ru and P, as previously discussed. The deposition method may include any of the methods disclosed herein, including CVD or PVD. The deposition method may use the methods and materials as previously discussed. The deposition method may be a plasma enhanced deposition method. In some embodiments, the Ru—P thin film 606 may be approximately 1 to 5 nanometers thick. The Ru—P thin film 606 may function as a metal diffusion barrier for an interconnect metal, a nucleation promotor, and/or an adhesion layer. In some embodiments, the Ru—P thin film 606 may have an interconnect metal feature 608 coupled to the Ru—P thin film 606. The interconnect metal feature 608 may be composed of aluminum, copper, nickel, cobalt, ruthenium, palladium or some other conducting metal or alloy.

In some embodiments, as illustrated by interconnect 630, the substrate 602 may have a liner layer 610, which may be an adhesion layer. The liner layer 610 may be composed of nitride such as manganese nitride, titanium nitride or tantalum nitrite or the like. In some embodiments, the liner layer 610 may have a Ru—P thin film 606 coupled to the liner layer 610. The Ru—P thin film 606 may be formed by a deposition method using a precursor containing Ru or Ru and P, as previously discussed. The deposition method may include any of the methods disclosed herein, including CVD or PVD. The deposition method may use the methods and materials as previously discussed. The deposition method may be a plasma enhanced deposition method. In some embodiments, the Ru—P thin film 606 may be approximately 1 to 5 nanometers thick. The Ru—P thin film 606 may function as a metal diffusion barrier for an interconnect metal, a nucleation promotor, and/or an adhesion layer. In some embodiments, the Ru—P thin film 606 may have an interconnect metal feature 608 coupled to the Ru—P thin film 606. The interconnect metal feature 608 may be composed of aluminum, copper, nickel, cobalt, ruthenium, palladium or some other conducting metal or alloy.

The Ru—P thin films may provide advantages over other thin films, where the advantages may include one or more of the following; highly conformal, ultrathin, a good conductive liner, a good work function metal, a good diffusion barrier, and/or a good adhesion layer/nucleation layer.

Figure 7:
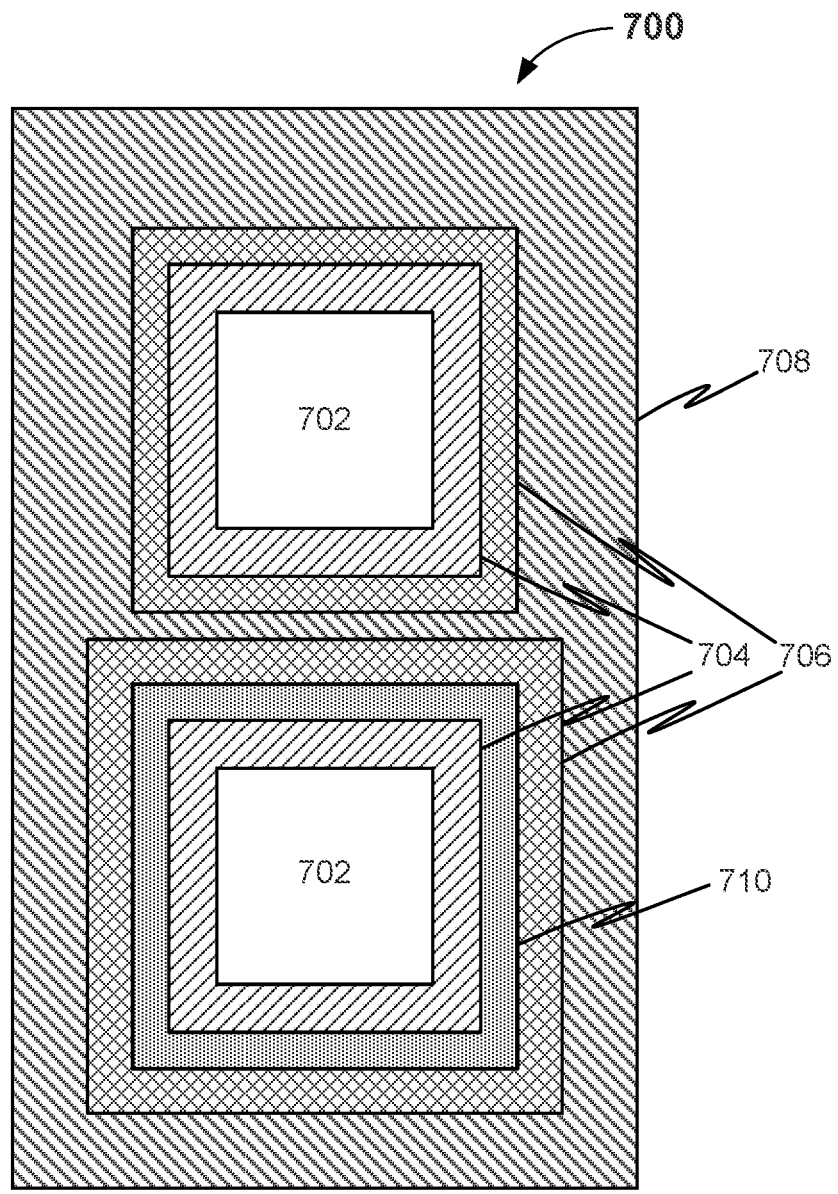
FIG. 7 schematically illustrates a cross-section of a gate region of a transistor having a thin film of ruthenium-phosphorus on a nanowire structure, in accordance with some embodiments.

FIG. 7 schematically illustrates a cross-section of a gate region of a transistor 700 having a thin film of ruthenium-phosphorus 706 on a nanowire structure, in accordance with some embodiments. In some embodiments, the transistor 700 may be a silicon-, a silicon germanium- or a germanium-based transistor. In some embodiments, the transistor may have a nanowire core 702 comprised of a substrate material, as illustrated. The substrate material may be any suitable material, such as silicon, silicon germanium, or germanium and may be treated and/or doped as previously discussed.

In some embodiments, the nanowire core 702 may have a high-kappa dielectric material layer 704 coupled to and surrounding the nanowire core 702. The high-kappa dielectric material may be a material as previously described.

In some embodiments, the high-kappa dielectric material layer 704 may have a Ru—P thin film 706 coupled to and surrounding the high-kappa dielectric material layer 704. The Ru—P thin film 706 may be formed by a deposition method using a precursor containing Ru or Ru and P as previously discussed. The deposition method may include any of the methods disclosed herein, including CVD or PVD. The deposition method may use the methods and materials as previously discussed. The deposition method may be a plasma enhanced deposition method. In some embodiments, the Ru—P thin film 706 may be approximately to 5 nanometers thick. The Ru—P thin film 706 may function as a metal diffusion barrier, a nucleation promotor, and/or an adhesion layer.

In some embodiments, the Ru—P thin film 706 may have a gate material layer (work function layer) 708 coupled to and surrounding the Ru—P thin film 706. The gate material layer 708 may be composed of aluminum or some other conducting metal. The gate material layer may be doped polysilicon. In some embodiments, the nanowire layered structure described above may include more than one nanowire structure, with the additional structures surrounded by the gate material layer 708, as illustrated.

In some embodiments, the high-kappa dielectric material layer 704 may have a liner material layer 710 coupled to and surrounding the high-kappa dielectric material layer 704. The liner material may be a dielectric material such as a nitride of silicon, titanium, or tantalum. The liner material may be approximately 5-100 Angstroms thick. In some embodiments, the liner material layer 710 may have a Ru—P thin film 706 coupled to and surrounding the liner material layer 710, as illustrated.

The Ru—P thin films may provide advantages over other thin films, where the advantages may include one or more of the following; highly conformal, ultrathin, a good conductive liner, a good work function metal, a good diffusion barrier, and/or a good adhesion layer/nucleation layer.

Figure 8:
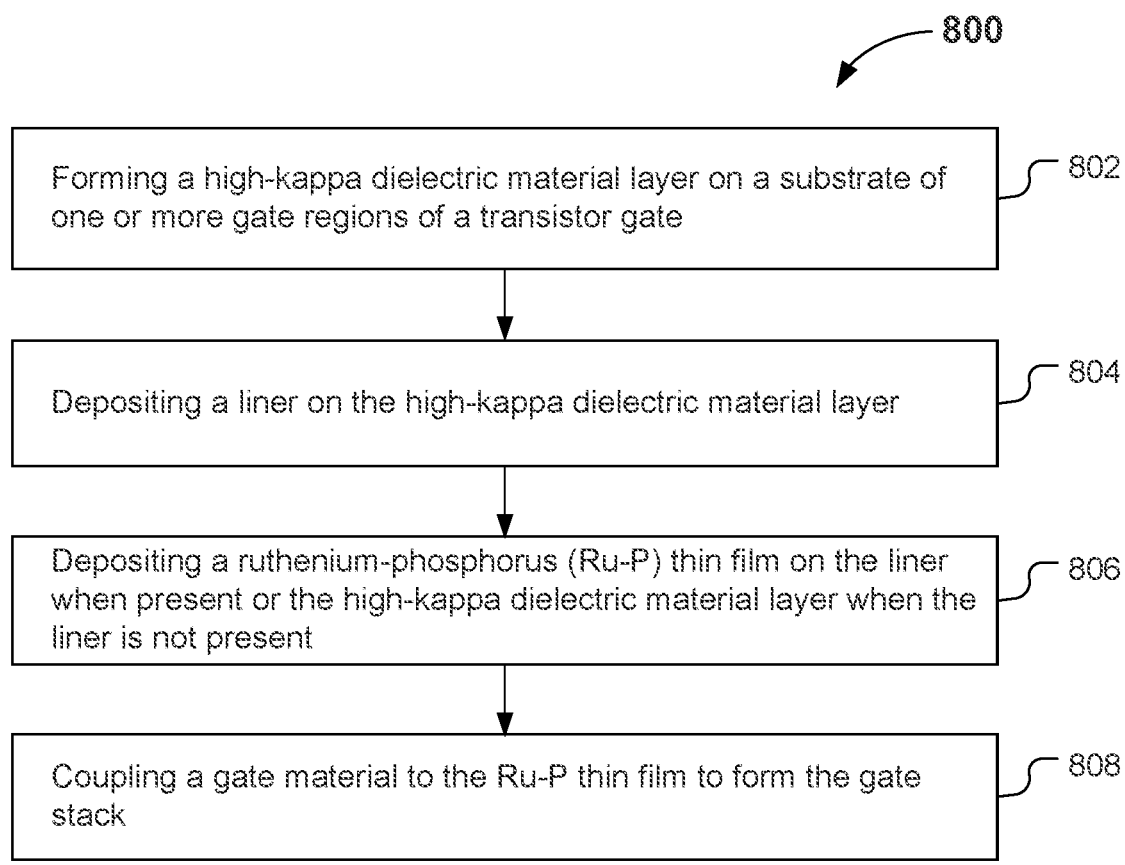
FIG. 8 schematically illustrates a process for making a transistor gate stack of a semiconductor device including a thin film composed of ruthenium phosphorus, in accordance with some embodiments.

FIG. 8 schematically illustrates a process 800 for making a transistor gate stack of a semiconductor device including a thin film composed of ruthenium phosphorus, in accordance with some embodiments.

At 802 of the process 800, a high-kappa dielectric material layer may be formed on a substrate of one or more gate regions of a transistor gate. The gate stack may be for a multigate transistor. The multigate transistor may be a tri-gate transistor and may have multiple gates. The substrate may be one or more fins of the tri-gate transistor. The substrate may be composed of any suitable material, such as silicon, silicon germanium, germanium, or a group III-V based semiconductor material. A high-kappa dielectric material layer may be composed of, for example, hafnium-based high-kappa dielectrics, nitrided hafnium silicates (HfSiON) dielectric, hafnium silicate, zirconium silicate, hafnium dioxide and zirconium dioxide. A high-kappa dielectric material layer may be formed using any suitable process, such as ALD or CVD.

At 804 of the process 800, a liner, optionally, may be deposited in some embodiments on the high-kappa dielectric material layer. The liner may be composed of a dielectric material such as a nitride of silicon, titanium, or tantalum. The liner material may be approximately 5-100 Angstroms thick.

At 806 of the process 800, a ruthenium-phosphorus (Ru—P) thin film may be deposited on the high-kappa dielectric material layer or may be deposited on the liner if the liner is deposited on the high-kappa dielectric material layer. The Ru—P film may be deposited by a chemical vapor deposition (CVD) process, wherein the CVD process may including placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film. The Ru—P thin film may be approximately to 5 nanometers thick. The precursor may include $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, wherein the R group is methyl, ethyl, propyl, isopropyl or t-butyl, or a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(alkyl-cyclopentadienyl) ruthenium, wherein the alkyl group is methyl, ethyl, propyl, isopropyl or t-butyl. The depositing of the ruthenium containing precursor may include co-flow of a co-reactant, wherein the co-reactant includes hydrogen ($H_2$); ammonia ($NH_3$); phosphine ($PH_3$), an alkylphoshine such as a monoalkylphoshine ($H_2PR$), a dialkylphoshine (HPRR') or an trialkylphoshine (PRR'R'') where R, R' and R'' may be methyl, ethyl, propyl, isopropyl, or t-butyl; or a substituted or unsubstituted hydrazine. The depositing of the ruthenium containing precursor may include plasma enhanced CVD and co-flow of co-reactant ammonia.

At 808 of the process 800, a gate material may be coupled to the Ru—P thin film to form the gate stack. The gate material may be a metal, such as aluminum. Alternatively, the gate material may be doped polysilicon. In some embodiments, the gate material may not be deposited, and the Ru—P film may be a work function metal for a transistor gate.

The Ru—P thin films may provide advantages over other thin films, where the advantages may include one or more of the following: highly conformal, ultrathin, a good conductive liner, a good work function metal, a good diffusion barrier, and/or a good adhesion layer/nucleation layer.

Various operations are described as multiple discrete operations in turn, in a manner that is most helpful in understanding the claimed subject matter. However, the order of description should not be construed as to imply that these operations are necessarily order dependent.

Figure 9:
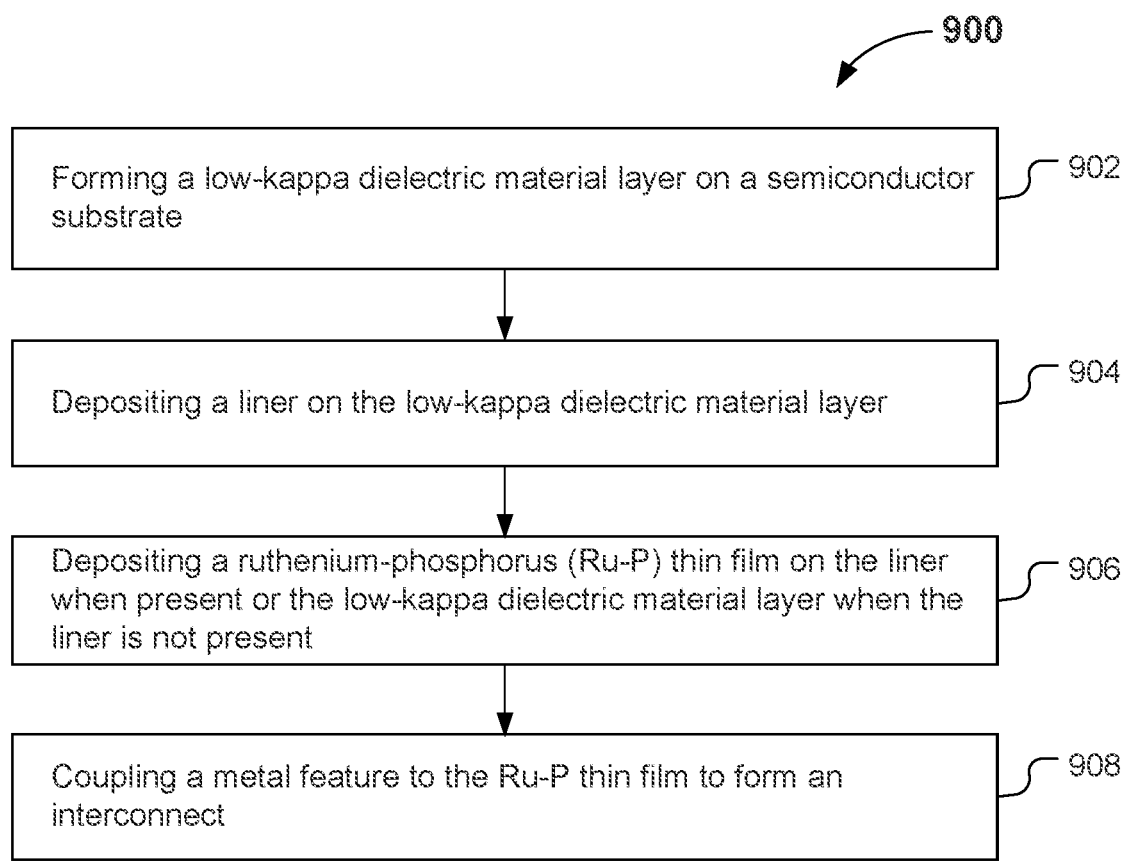
FIG. 9 schematically illustrates a process for making an interconnect structure of a semiconductor device including a thin film composed of ruthenium phosphorus, in accordance with some embodiments.

FIG. 9 schematically illustrates a process 900 for making an interconnect structure of a semiconductor device including a thin film composed of ruthenium phosphorus, in accordance with some embodiments.

At 902 of process 900, a low-kappa dielectric material layer may be formed on a substrate. The substrate may be a semiconductor substrate. The substrate may be silicon, silicon germanium, germanium, and/or a group III-V semiconductor material. The low-kappa dielectric material layer may be an interlayer dielectric material (ILD) such as a build-up material. A low-kappa dielectric material may include, for example, carbon infused/doped silicon dioxide or fluorinated silicon dioxide.

At 904 of the process 900, a liner, optionally, may be deposited in some embodiments on the low-kappa dielectric material layer. The liner may be composed of a conductive material such as a nitride of manganese, titanium, or tantalum. The liner material may be approximately 5-100 Angstroms thick.

At 906 of process 900, a ruthenium-phosphorus (Ru—P) thin film may be deposited on the low-kappa dielectric material layer when the liner is not deposited on the low-kappa dielectric material layer. If the liner is deposited at 904 of process 900, then the Ru—P film may be deposited on the liner. The Ru—P film may be deposited by a chemical vapor deposition (CVD) process, wherein the CVD process may include placing the semiconductor device in a vacuum chamber, heating the semiconductor device at a temperature of approximately 200 to 450 degrees Celsius, depositing a ruthenium precursor on the low-kappa dielectric material layer, and curing the ruthenium precursor to form the Ru—P thin film. The Ru—P thin film may be approximately 1 to 5 nanometers thick. The precursor may include $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, wherein the R group is methyl, ethyl, propyl, isopropyl or t-butyl, or a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(alkyl-cyclopentadienyl) ruthenium, and wherein the alkyl group is methyl, ethyl, propyl, t-butyl, or isopropyl. The depositing of the ruthenium containing precursor may include co-flow of a co-reactant, wherein the co-reactant includes hydrogen ($H_2$); ammonia ($NH_3$); phosphine ($PH_3$), an alkylphoshine such as a monoalkylphoshine ($H_2PR$), a dialkylphoshine (HPRR') or an trialkylphoshine (PRR'R'') where R, R' and R'' may be methyl, ethyl, propyl, isopropyl, or t-butyl; or a substituted or unsubstituted hydrazine. The depositing of the ruthenium containing precursor may include plasma enhanced CVD and co-flow of co-reactant ammonia.

At 908 of process 900, a metal feature may be formed on the Ru—P thin film. The metal feature may be a semiconductor interconnect structure. The metal feature may be composed of copper, aluminum, nickel, cobalt, ruthenium, palladium or some other metal or alloy. Alternatively, the metal feature may be composed of doped polysilicon.

The Ru—P thin films may provide advantages over other thin films, where the advantages may include one or more of the following: highly conformal, ultrathin, a good conductive liner, a good work function metal, a good diffusion barrier, and/or a good adhesion layer/nucleation layer.

Various operations are described as multiple discrete operations in turn, in a manner that is most helpful in understanding the claimed subject matter. However, the order of description should not be construed as to imply that these operations are necessarily order dependent.

Figure 10:
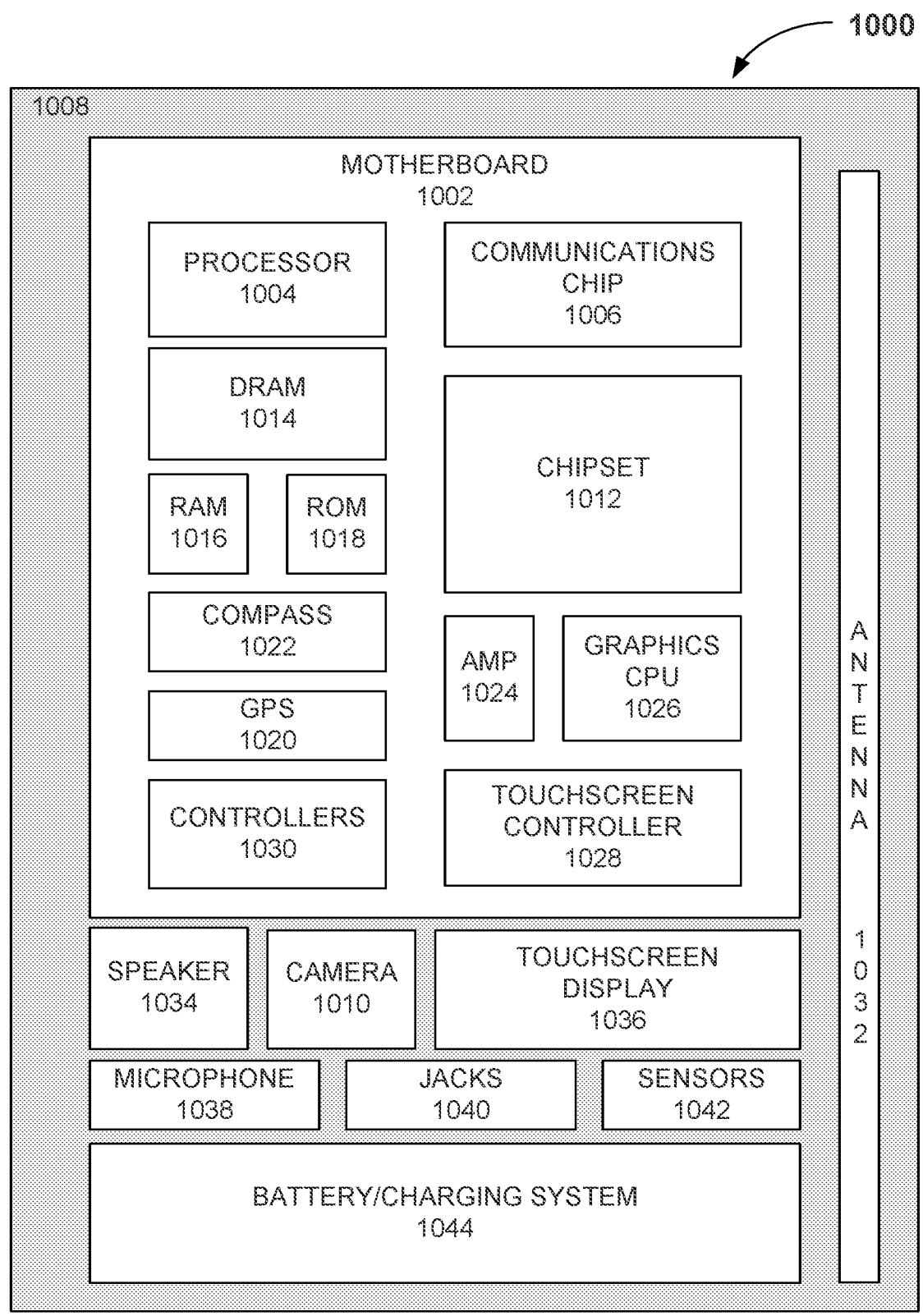
FIG. 10 illustrates a system with a semiconductor device with a ruthenium-phosphorus alloy film deposited on the device, in accordance with some embodiments.

Embodiments of the present disclosure may be implemented into a system using any suitable hardware and/or software to configure as desired. FIG. 10 illustrates a system with a semiconductor device with a Ru—P thin film, in accordance with some embodiments.

The computing device 1000 may house a board such as motherboard 1002 (e.g., in housing 1008). The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., dynamic random access memory (DRAM) 1014), non-volatile memory (e.g., read only memory (ROM) 1018), flash memory, random access memory (RAM) 1016, a graphics processor 1026, a digital signal processor, a crypto processor, a chipset 1012, an antenna 1032, a display, a touchscreen display 1036, a touchscreen controller 1028, a battery 1044, an audio codec, a video codec, a power amplifier 1024, a global positioning system (GPS) device 1020, a compass 1022, microelectromechanical systems (MEMS) sensor 1042, a Geiger counter, an accelerometer, a gyroscope, a speaker 1034, a camera 1010, and a mass storage device (such as hard disk drive), compact disk (CD), digital versatile disk (DVD), controllers 1030, microphone 1038, and/or jacks 1040, and so forth. Not all of these components are illustrated in the figure.

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (CPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as WiGig, Wi-Fi and Bluetooth and a second communication chip 1006 may be dedicated to longer range wireless communications such as GPS, EDGE, GPRS, CDMA, WiMAX, LTE, EV-DO, and others.

The processor 1004, communication chip 1006, chipset 1012, memory chips 1014, 1016, 1018, and/or other devices with chips shown in computing device 1000 may contain one or more thin metal films as described herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1000 may be a mobile computing device in some embodiments. In further implementations, the computing device 1000 may be any other electronic device that processes data.

Computing device 1000 including one or more IC's with the Ru—P thin films may have performance advantages over IC's having other thin films. The performance advantages provided by the Ru—P thin films may relate to one or more of the following advantages of the Ru—P thin films over other thin films: highly conformal, ultrathin, a good conductive liner, a good work function metal, a good diffusion barrier, and/or a good adhesion layer/nucleation layer.

EXAMPLES

According to various embodiments, the present disclosure describes semiconductor devices with ruthenium phosphorus thin films deposited in a gate stack of a transistor device or in an interconnect structure and further describes the processes to deposit the thin films.

Example 1 of a semiconductor device may comprise one or more transistors with a gate having a gate stack including a semiconductor substrate, a high-kappa dielectric material layer coupled to a surface of the semiconductor substrate, a ruthenium-phosphorus (Ru—P) thin film coupled to the high-kappa dielectric material layer, and a gate material coupled to the Ru—P thin film; and electrical circuitry coupled to the one or more transistors.

Example 2 may include the subject matter of Example 1 and other examples herein, wherein the one or more transistors include a multigate transistor.

Example 3 may include the subject matter of Example 2 and other examples herein, wherein the multigate transistor is a tri-gate transistor and the semiconductor substrate is a fin of the tri-gate transistor.

Example 4 may include the subject matter of Example 1 and other examples herein, wherein the semiconductor substrate is composed of silicon, silicon germanium, or germanium.

Example 5 may include the subject matter of Example 1 and other examples herein, wherein the Ru—P thin film is approximately 1 to 5 nanometers thick.

Example 6 may include the subject matter of Example 1 and other examples herein, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

Example 7 may include the subject matter of Example 6 and other examples herein, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl, or t-butyl.

Example 8 may include the subject matter of Example 6 and other examples herein, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, R' and R" are methyl, ethyl, propyl, isopropyl, or t-butyl.

Example 9 may include the subject matter of Example 6 and other examples herein, wherein the depositing of the ruthenium precursor includes plasma enhanced CVD and co-flow of co-reactant ammonia.

Example 10 may include the subject matter of any one of Examples 1-9 and other examples herein, wherein the examples further may comprise a liner disposed between and coupled to the high-kappa dielectric material layer and the Ru—P thin film.

Example 11 of a semiconductor device may comprise one or more transistors with a gate having a gate stack including a group III-V based semiconductor substrate, a high-kappa dielectric material layer coupled to a surface of the semiconductor substrate, and a ruthenium-phosphorus (R—P) thin film coupled to the high-kappa dielectric material layer; and electrical circuitry coupled to the one or more transistors.

Example 12 may include the subject matter of Example 11 and other examples herein, wherein the one or more transistors includes a multigate transistor.

Example 13 may include the subject matter of Example 12 and other examples herein, wherthe multigate transistor is a tri-gate transistor and the semiconductor substrate is a fin of the tri-gate transistor.

Example 14 may include the subject matter of Example 11 and other examples herein, wherthe Ru—P thin film is approximately 1 to 5 nanometers thick.

Example 15 may include the subject matter of Example 11 and other examples herein, wherthe Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

Example 16 may include the subject matter of Example 15 and other examples herein, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl or t-butyl.

Example 17 may include the subject matter of Example 15 and other examples herein, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, and R" are methyl, ethyl, propyl, isopropyl, or t-butyl.

Example 18 may include the subject matter of Example 15 and other examples herein, wherein the depositing of the ruthenium precursor includes plasma enhanced CVD and co-flow of co-reactant ammonia.

Example 19 may include the subject matter of any one of Examples 11-18 and other examples herein, wherein the examples further may comprise a liner disposed between and coupled to the high-kappa dielectric material layer and the Ru—P thin film.

Example 20 of a semiconductor device may comprise an interconnect structure, including a low-kappa dielectric semiconductor substrate, a ruthenium-phosphorus (Ru—P) thin film coupled to the semiconductor substrate, a metal deposited on the Ru—P thin film; and electrical circuitry coupled to the interconnect structure.

Example 21 may include the subject matter of Example 20 and other examples herein, wherein the Ru—P thin film is approximately 1 to 5 nanometers thick.

Example 22 may include the subject matter of Example 20 and other examples herein, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the low-kappa dielectric material layer, and curing the ruthenium precursor to form the Ru—P thin film.

Example 23 may include the subject matter of Example 22 and other examples herein, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl or t-butyl.

Example 24 may include the subject matter of Example 22 and other examples herein, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, R' and R" are methyl, ethyl, propyl, isopropyl, or t-butyl.

Example 25 may include the subject matter of Example 22 and other examples herein, wherein the depositing of the ruthenium precursor includes plasma enhanced CVD and co-flow of co-reactant ammonia.

Example 26 may include the subject matter of any one of Examples 20-25 and other examples herein, wherein the examples further may comprise a liner disposed between and coupled to the low-kappa dielectric material layer and the Ru—P thin film.

Example 27 of a semiconductor device may comprise a nanowire substrate; a high-kappa dielectric material layer coupled to and surrounding the nanowire substrate; a ruthenium-phosphorus (Ru—P) thin film coupled to and surrounding the high-kappa dielectric material layer; and a metal coupled to and surrounding the ruthenium-phosphorus thin film.

Example 28 may include the subject matter of Example 27 and other examples herein, wherein the nanowire substrate is composed of silicon, silicon germanium, germanium or a Group III-V semiconductor.

Example 29 may include the subject matter of Example 27 and other examples herein, wherein the Ru—P thin film is approximately 1 to 5 nanometers thick.

Example 30 may include the subject matter of Example 27 and other examples herein, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

Example 31 may include the subject matter of Example 30 and other examples herein, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, t-butyl, or isopropyl.

Example 32 may include the subject matter of Example 30 and other examples herein, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, and R" are methyl, ethyl, propyl, isopropyl, or t-butyl.

Example 33 may include the subject matter of Example 30 and other examples herein, wherein the depositing of the ruthenium precursor includes plasma enhanced CVD and co-flow of co-reactant ammonia.

Example 34 may include the subject matter of any one of Examples 27-33 and other examples herein, wherein the examples further may comprise a liner disposed between and coupled to the high-kappa dielectric material layer and the Ru—P thin film, the liner surrounding the high-kappa dielectric material layer, and the Ru—P thin film surrounding the liner.

Example 35 of a process for making a transistor gate stack of a semiconductor device may comprise forming a high-kappa dielectric material layer on a substrate of one or more gate regions of a transistor gate; depositing a ruthenium-phosphorus (Ru'P) thin film on the high-kappa dielectric material layer; and coupling a gate material to the Ru'P thin film to form the gate stack.

Example 36 may include the subject matter of Example 35 and other examples herein, wherein the one or more gate regions includes a gate region of a multigate transistor.

Example 37 may include the subject matter of Example 36 and other examples herein, wherein the multigate transistor is a tri-gate transistor and the substrate is a fin of the tri-gate transistor.

Example 38 may include the subject matter of Example 35 and other examples herein, wherein the substrate is composed of silicon, silicon germanium, or germanium.

Example 39 may include the subject matter of Example 35 and other examples herein, wherein the Ru—P thin film is approximately 1 to 5 nanometers thick.

Example 40 may include the subject matter of Example 35 and other examples herein, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

Example 41 may include the subject matter of Example 40 and other examples herein, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl or t-butyl.

Example 42 may include the subject matter of Example 40 and other examples herein, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, R' and R" are methyl, ethyl, propyl, isopropyl, or t-butyl.

Example 43 may include the subject matter of Example 40 and other examples herein, wherein the depositing of the ruthenium precursor includes plasma enhanced CVD and co-flow of co-reactant ammonia.

Example 44 may include the subject matter of any one of Examples 35-43 and other examples herein, wherein the examples further may comprise depositing a liner between the high-kappa dielectric material layer and the Ru—P thin film.

Example 45 of a process for making a transistor gate stack of a semiconductor device may comprise forming a high-kappa dielectric material layer on a group III-V based semiconductor substrate of one or more gate regions of a transistor gate; depositing a ruthenium-phosphorus (Ru—P) thin film on the high-kappa dielectric material layer.

Example 46 may include the subject matter of Example 45 and other examples herein, wherein the one or more gate regions includes a gate region of a multigate transistor.

Example 47 may include the subject matter of Example 46 and other examples herein, wherein the multigate transistor is a tri-gate transistor and the semiconductor substrate is a fin of the tri-gate transistor.

Example 48 may include the subject matter of Example 45 and other examples herein, wherein the Ru—P thin film is approximately 1 to 5 nanometers thick.

Example 49 may include the subject matter of Example 45 and other examples herein, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

Example 50 may include the subject matter of Example 49 and other examples herein, wherein the precursor includes Ru(PF$_3$)$_4$H$_2$, cis-H$_2$Ru(P(CH$_3$)$_3$)$_4$, R$_2$PCH$_2$CH$_2$PR$_2$, R$_2$PCH$_2$CH$_2$NHCH$_2$CH$_2$PR$_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl or t-butyl.

Example 51 may include the subject matter of Example 49 and other examples herein, wherein the depositing of the ruthenium precursor includes co-flow of a co-reactant, wherein the co-reactant includes hydrogen (H$_2$), ammonia (NH$_3$), phosphine (PH$_3$), monoalkylphosphine (H$_2$PR), dialkylphosphine (HPRR'), or trialkylphosphine (PRR'R"), or a substituted or unsubstituted hydrazine, wherein R, R' and R" are methyl, ethyl, propyl, isopropyl, or t-butyl.

Example 52 may include the subject matter of Example 49 and other examples herein, wherein the depositing of the ruthenium precursor includes plasma enhanced CVD and co-flow of co-reactant ammonia.

Example 53 may include the subject matter of any one of Examples 45-52 and other examples herein, wherein the examples further may comprise depositing a liner between the high-kappa dielectric material layer and the Ru—P thin film.

Example 54 of a process for making an interconnect of a semiconductor device may comprise forming a low-kappa dielectric material layer on a substrate; depositing a ruthenium-phosphorus (Ru—P) thin film on the low-kappa dielectric material layer: and forming a metal feature on the Ru—P thin film.

Example 55 may include the subject matter of Example 54 and other examples herein, wherein the low-kappa dielectric material layer is an interlayer dielectric material.

Example 56 may include the subject matter of Example 54 and other examples herein, wherein the Ru—P thin film is approximately 1 to 5 nanometers thick.

Example 57 may include the subject matter of Example 54 and other examples herein, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the low-kappa dielectric material layer, and curing the ruthenium precursor to form the Ru—P thin film.

Example 58 may include the subject matter of Example 57 and other examples herein, wherein the precursor includes Ru(PF$_3$)$_4$H$_2$, cis-H$_2$Ru(P(CH$_3$)$_3$)$_4$, R$_2$PCH$_2$CH$_2$PR$_2$, R$_2$PCH$_2$CH$_2$NHCH$_2$CH$_2$PR$_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl or t-butyl.

Example 59 may include the subject matter of Example 57 and other examples herein, wherein the depositing of the ruthenium precursor includes co-flow of a co-reactant, wherein the co-reactant includes hydrogen (H$_2$), ammonia (NH$_3$), phosphine (PH$_3$), monoalkylphosphine (H$_2$PR), dialkylphosphine (HPRR'), or trialkylphosphine (PRR'R"), or a substituted or unsubstituted hydrazine, wherein R, R' and R" are methyl, ethyl, propyl, isopropyl, or t-butyl.

Example 60 may include the subject matter of Example 57 and other examples herein, wherein the depositing of the ruthenium precursor includes plasma enhanced CVD and co-flow of co-reactant ammonia.

Example 61 may include the subject matter of any one of Examples 54-60 and other examples herein, wherein the examples further may comprise depositing a liner between the low-kappa dielectric material layer and the Ru—P thin film.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments. The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in fight of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:
1. A semiconductor device, comprising:
one or more transistors with a gate having a gate stack including
a fin including a semiconductor substrate material,
a high-kappa dielectric material layer adjacent to and in contact with the fin, a ruthenium-phosphorus (Ru—P) thin film adjacent to and conformally in contact with the high-kappa dielectric material layer, and a single layer of gate material adjacent to and in contact with the Ru—P thin film, wherein the Ru—P thin film is to function as a diffusion barrier, a nucleation layer, a conductive liner, and an adhesion layer; and electrical circuitry coupled to the one or more transistors.

2. The semiconductor device of claim 1, wherein the one or more transistors are one or more tri-gate transistors, and the semiconductor substrate is a fin of the tri-gate transistor.

3. The semiconductor device of claim 1, wherein the semiconductor substrate is composed of silicon, silicon germanium, or germanium.

4. The semiconductor device of claim 1, wherein the Ru—P thin film is approximately 1 to 5 nanometers thick.

5. The semiconductor device of claim 1, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

6. The semiconductor device of claim 5, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl, or t-butyl.

7. The semiconductor device of claim 6, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, R' and R" are methyl, ethyl, propyl, isopropyl, or t-butyl.

8. The semiconductor device of claim 6, wherein the depositing of the ruthenium precursor includes plasma enhanced CVD and co-flow of co-reactant ammonia.

9. The semiconductor device of claim 1, further comprising:
a liner disposed between and coupled to the high-kappa dielectric material layer and the Ru—P thin film.

10. A semiconductor device, comprising:
one or more transistors with a gate having a gate stack including
a fin including a group III—V based semiconductor substrate,
a high-kappa dielectric material layer in contact with and conformally covering the fin, and
a ruthenium-phosphorus (Ru—P) thin film in contact with and conformally covering the high-kappa dielectric material layer; and
a single layer of gate material adjacent to and in contact with the Ru—P thin film, wherein the Ru—P thin film is to function as a diffusion barrier, a nucleation layer, a conductive liner, and an adhesion layer; and
electrical circuitry coupled to the one or more transistors.

11. The semiconductor device of claim 10, wherein the one or more transistors are one or more tri-gate transistors, and the semiconductor substrate is a fin of the tri-gate transistor.

12. The semiconductor device of claim 10, wherein the Ru—P thin film is approximately 1 to 5 nanometers thick, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

13. The semiconductor device of claim 12, wherein the precursor includes $Ru(PF_3)_4H_2$, cis-$H_2Ru(P(CH_3)_3)_4$, $R_2PCH_2CH_2PR_2$, $R_2PCH_2CH_2NHCH_2CH_2PR_2$, a bidentate ligand containing phosphorus, a tridentate ligand containing phosphorus, bis(cyclopentadienyl) ruthenium, a ruthenium amidinate complex, a ruthenium diazadiene complex, a ruthenium carbonyl complex, or bis(R-cyclopentadienyl) ruthenium, and wherein R is methyl, ethyl, propyl, isopropyl or t-butyl.

14. The semiconductor device of claim 12, wherein the depositing of the ruthenium precursor includes co-flow of a co-reactant, wherein the co-reactant includes hydrogen ($H_2$), ammonia ($NH_3$), phosphine ($PH_3$), monoalkylphosphine ($H_2PR$), dialkylphosphine (HPRR'), or trialkylphosphine (PRR'R"), or a substituted or unsubstituted hydrazine, wherein R, R' and R" are methyl, ethyl, propyl, isopropyl, or t-butyl.

15. The semiconductor device of claim 12, wherein the depositing of the ruthenium precursor includes plasma enhanced CVD and co-flow of co-reactant ammonia.

16. The semiconductor device of claim 10, further comprising:
a liner disposed between and coupled to the high-kappa dielectric material layer and the Ru—P thin film.

17. A semiconductor device, comprising:
a nanowire substrate;
a high-kappa dielectric material layer surrounding the nanowire substrate, and adjacent to and in contact with the nanowire substrate;
a ruthenium-phosphorus (Ru—P) thin film surrounding the high-kappa dielectric material layer, and adjacent to and in contact with the high-kappa dielectric material layer; and
a single metal layer adjacent to and in contact with the Ru—P thin film, wherein the Ru—P thin film is to function as a diffusion barrier, a nucleation layer, a conductive liner, and an adhesion layer.

18. The semiconductor device of claim 17, wherein the nanowire substrate is composed of silicon, silicon germanium, germanium, or a Group III-V semiconductor.

19. The semiconductor device of claim 17, wherein the Ru—P thin film is approximately 1 to 5 nanometers thick, wherein the Ru—P thin film is deposited by a chemical vapor deposition (CVD) process, wherein the CVD process includes: placing the semiconductor device in a vacuum chamber, heating the semiconductor device at a temperature of approximately 200 to 450 degrees Celsius, depositing a ruthenium precursor on the high-kappa dielectric material layer, and curing the ruthenium precursor to form the Ru—P thin film.

* * * * *